(12) United States Patent
Tsai et al.

(10) Patent No.: US 8,384,222 B2
(45) Date of Patent: Feb. 26, 2013

(54) SEMICONDUCTOR DEVICE AND MANUFACTURING METHOD THEREOF

(76) Inventors: Chia-Lun Tsai, Hsinchu (TW); Ching-Yu Ni, Hsinchu (TW); Jack Chen, Hsinchu (TW); Wen-Cheng Chien, Hsinchu (TW)

( * ) Notice: Subject to any disclaimer, the term of this patent is extended or adjusted under 35 U.S.C. 154(b) by 0 days.

(21) Appl. No.: 13/030,887

(22) Filed: Feb. 18, 2011

(65) Prior Publication Data
US 2011/0140248 A1 Jun. 16, 2011

Related U.S. Application Data

(62) Division of application No. 12/466,656, filed on May 15, 2009, now Pat. No. 7,968,448.

(60) Provisional application No. 61/053,810, filed on May 16, 2008.

(51) Int. Cl.
*H01L 23/48* (2006.01)
(52) U.S. Cl. .................. 257/765; 257/E23.159
(58) Field of Classification Search .............. 257/734, 257/748, 765, 766, 503, 758, 784, E23.142, 257/E23.159
See application file for complete search history.

(56) References Cited

U.S. PATENT DOCUMENTS
7,745,931 B2 * 6/2010 Takao ..................... 257/734

FOREIGN PATENT DOCUMENTS
JP 2004-134640 A 4/2004

* cited by examiner

*Primary Examiner* — Quoc Hoang
(74) *Attorney, Agent, or Firm* — Birch, Stewart, Kolasch & Birch, LLP

(57) ABSTRACT

A semiconductor device and manufacturing method thereof are disclosed. The device comprises a semiconductor die, a passivation layer, a wiring redistribution layer (RDL), an Ni/Au layer, and a solder mask. The semiconductor die comprises a top metal exposed in an active surface thereof. The passivation layer overlies the active surface of the semiconductor die, and comprises a through passivation opening overlying the top metal. The wiring RDL, comprising an Al layer, overlies the passivation layer, and electrically connects to the top metal via the passivation opening. The solder mask overlies the passivation layer and the wiring RDL, exposing a terminal of the wiring RDL.

19 Claims, 11 Drawing Sheets

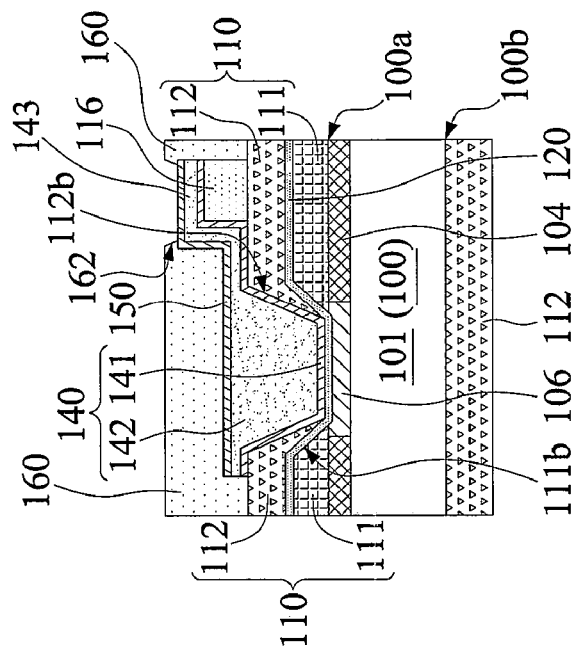
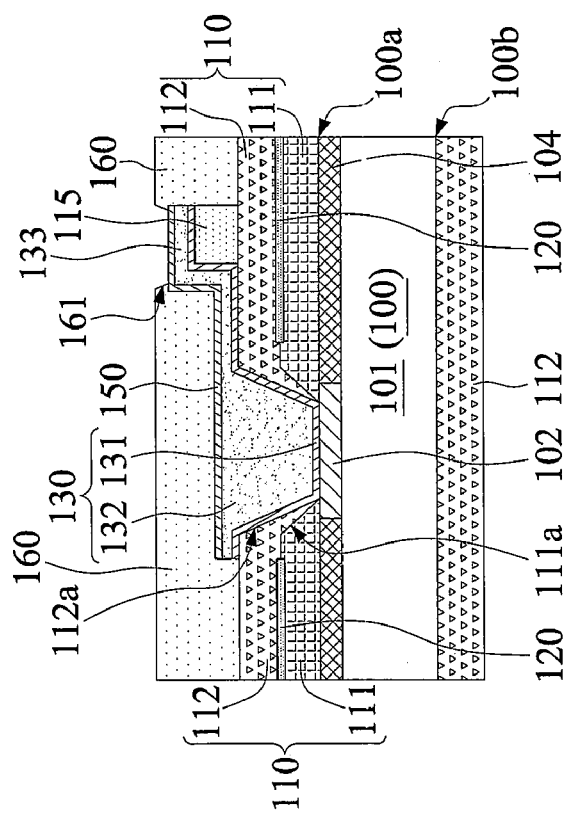

SEMICONDUCTOR DEVICE AND MANUFACTURING METHOD THEREOF

CROSS REFERENCE TO RELATED APPLICATIONS

This application is a Divisional of application Ser. No. 12/466,656, filed May 15, 2009 now U.S. Pat. No. 7,968,448, which claims the benefit of provisional Application No. 61/053,810, filed May 16, 2008, the entirety of which are incorporated by reference herein.

BACKGROUND OF THE INVENTION

1. Field of the Invention

The invention relates to semiconductor technology and more particularly to a light sensing device.

2. Description of the Related Art

In a wafer level packaging process for semiconductor devices, a post passivation interconnection (PPI) structure is formed for redistribution of pads on semiconductor chips in order to effectively use the surface area of chips to reduce package size. The PPI structure typically comprises a wiring redistribution layer and a passivation layer. A terminal of the wiring redistribution layer is not covered by the passivation layer. The PPI structure usually suffers from poor adhesion between the wiring redistribution layer and the passivation layer thereof, and from poor adhesion between the terminal of the wiring redistribution layer and a connecting device connecting the terminal with an exterior device, thus negatively affecting the reliability of the packaged semiconductor devices.

Meanwhile, with requirements for denser circuit routing and smaller semiconductor chip sizes, it is necessary to increase the layers of metal line patterns and decrease the line pitch to effectively connect every individual element in semiconductor chips. A plurality of layers of insulating films or materials are typically called inter-layer dielectric (ILD) layers for isolating metal interconnections of different levels. Silicon oxide is usually utilized as the ILD layers, wherein a dielectric constant is between 4.0 and 4.5. However, with shorter metal line pitch, the capacitance value in a layer or between layers increases because the capacitance value is inversely proportional to line pitch, increasing the RC delay time. With the increased RC delay time negatively affecting the signal communication time in the circuit, it is necessary to decrease the dielectric constant of the ILD layers to improve circuit performance, such as clock responses.

Dielectric materials with dielectric constant of less than 3 are typically called low k dielectric materials. When low k dielectric materials are utilized as the dielectric layers between metal lines, the adhesive strength between the low k materials and metals are lower than that between silicon oxide and metals. As such, ILD layers of the low k dielectric materials often peel due to exterior mechanical stress during the semiconductor packaging process or operation of packaged semiconductor devices, thus negatively affecting device performance or causing device malfunction.

BRIEF SUMMARY OF THE INVENTION

Embodiments of the invention provide semiconductor devices and manufacturing methods thereof, wherein the reliability of the semiconductor devices increases by increasing adhesion between the wiring redistribution layers and passivation layers and by improving the structures of the passivation layers.

Embodiments of the invention further provide semiconductor devices and manufacturing methods thereof, wherein the peeling problem with the ILD layers of low k dielectric materials from exterior mechanical stress is prevented or decreased.

An embodiment of the invention further provides a semiconductor device comprising a semiconductor die, a conductive electrode, a passivation layer, a wiring redistribution layer, an Ni/Au layer, and a solder mask. The semiconductor die comprises a first surface. The conductive electrode is exposed in the first surface. The passivation layer overlies the semiconductor die and comprises a through passivation opening overlying the conductive electrode. The wiring redistribution layer, comprising an Al layer, overlies the passivation layer and electrically connects to the conductive electrode via the passivation opening. The Ni/Au layer overlies a top surface of the Al layer of the wiring redistribution layer. The solder mask overlies the passivation layer and the wiring redistribution layer, exposing a terminal of the wiring redistribution layer and the overlying Ni/Au layer.

An embodiment of the invention further provides another semiconductor device comprising a semiconductor die, a first conductive electrode, a second conductive electrode, a passivation layer, a metal layer, a first wiring redistribution layer, a second wiring redistribution layer, an Ni/Au layer, and a solder mask. The semiconductor die comprises a first surface. The first conductive electrode and a second conductive electrode are exposed in the first surface. The passivation layer overlies the semiconductor die and comprises a first through passivation opening overlying the first conductive electrode and a second through passivation opening overlying the second conductive electrode. The metal layer is embedded in the passivation layer, electrically connects to the second conductive electrode, and is electrically isolated from the first conductive electrode by the passivation layer. The first wiring redistribution layer, comprising a first Al layer, overlies the passivation layer and electrically connects to the first conductive electrode via the first passivation opening. The second wiring redistribution layer, comprising a second Al layer, overlies the passivation layer and electrically connects to the second conductive electrode via the second passivation opening. The Ni/Au layer overlies a top surface of the first Al layer of the first wiring redistribution layer and a top surface of the second Al layer of the second wiring redistribution layer. The solder mask overlies the passivation layer, the first wiring redistribution layer, and the second wiring redistribution layer, exposing a first terminal of the first wiring redistribution layer and the overlying Ni/Au layer, and a second terminal of the second wiring redistribution layer and the overlying Ni/Au layer.

An embodiment of the invention further provides a manufacturing method for a semiconductor device. First, a semiconductor wafer comprising at least one semiconductor die is provided. The at least one semiconductor die comprises a conductive electrode exposed in a first surface of the semiconductor wafer. Then, a passivation layer is formed overlying the first surface of the semiconductor die. The passivation layer comprises a through passivation opening overlying the conductive electrode. Next, a wiring redistribution layer, comprising an Al layer and a TiW layer on a bottom surface of the Al layer, is formed overlying the passivation layer. The wiring redistribution layer electrically connects to the conductive electrode via the passivation opening. Further, an Ni/Au layer is plated overlying a top surface of the Al layer of the wiring redistribution layer. Finally, a solder mask is formed overlying the passivation layer and the wiring redistribution layer, exposing a terminal of the wiring redistribution layer and the overlying Ni/Au layer. The formation of the passivation layer further comprises the subsequent steps. First, a first passivation film, comprising a first through opening overlying the conductive electrode, is formed overlying the semiconductor wafer. Then, a metal layer is formed overlying the first passivation film. Next, a sacrifice layer is filled in the first through opening. Next, a solution comprising an electro-deposition coating material is provided. Further, the semiconductor wafer is immersed into the solution. Thus, the electro-deposition coating material attaches to the metal layer beyond the sacrifice layer and a second surface opposing to the first surface of the semiconductor wafer, forming a second passivation film. Finally, the sacrifice layer is removed, resulting in the second passivation film comprising a second through opening overlying the conductive electrode. The second through opening functions as the passivation opening.

An embodiment of the invention further provides another manufacturing method for a semiconductor device. First, a semiconductor wafer comprising at least one semiconductor die is provided. The at least one semiconductor die comprises a first conductive electrode and a second conductive electrode exposed in a first surface of the semiconductor wafer. Then, a first passivation film is formed overlying the semiconductor wafer. The first passivation film comprises a first opening exposing the first conductive electrode, and a second opening exposing the second conductive electrode. Next, a resist material is formed. The resist material covers the first conductive electrode exposed by the first opening, but leaves the second conductive electrode exposed. Next, a metal layer is deposited overlying the first passivation film, the resist material, sidewalls of the second opening, and the exposed second conductive electrode. Next, the resist material is removed. Simultaneously, the metal layer thereon is also removed, leaving a discontinuous metal layer. The discontinuous metal layer overlies the first passivation film beyond the first opening and extends into the second opening. Next, a sacrifice material is filled in the first opening and the second opening. Next, a solution comprising an electro-deposition coating material is provided. Next, the semiconductor wafer is immersed into the solution. Thus, the electro-deposition coating material attaches to the discontinuous metal layer beyond the sacrifice layer and a second surface opposing to the first surface of the semiconductor wafer, forming a second passivation film. Next, the sacrifice layer is removed, resulting in the second passivation film comprising a third opening exposing the first conductive electrode and a fourth opening exposing the discontinuous metal layer overlying the second conductive electrode. Next, a first wiring redistribution layer and a second wiring redistribution layer are formed overlying the passivation layer. The first wiring redistribution layer comprises a first Al layer and a first TiW layer on a bottom surface of the first Al layer, and is electrically connected to the first conductive electrode via the third opening. The second wiring redistribution layer comprises a second Al layer and a second TiW layer on a bottom surface of the second Al layer, and is electrically connected to the second conductive electrode via the fourth opening and the discontinuous metal layer. Further, an Ni/Au layer is plated overlying a top surface of the first Al layer of the first wiring redistribution layer and a top surface of the second Al layer of the second wiring redistribution layer. Finally, a solder mask is formed overlying the passivation layer, the first wiring redistribution layer, and the second wiring redistribution layer, exposing a first terminal of the first wiring redistribution layer and the overlying Ni/Au layer, and a second terminal of the second wiring redistribution layer and the overlying Ni/Au layer.

Further scope of the applicability of the invention will become apparent from the detailed descriptions given hereinafter. It should be understood however, that the detailed descriptions and specific examples, while indicating preferred embodiments of the invention, are given by way of illustration only, as various changes and modifications within the spirit and scope of the invention will become apparent to those skilled in the Art from the detailed descriptions.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIGS. 3A and 3B show cross-sections of a semiconductor device of a second embodiment of the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
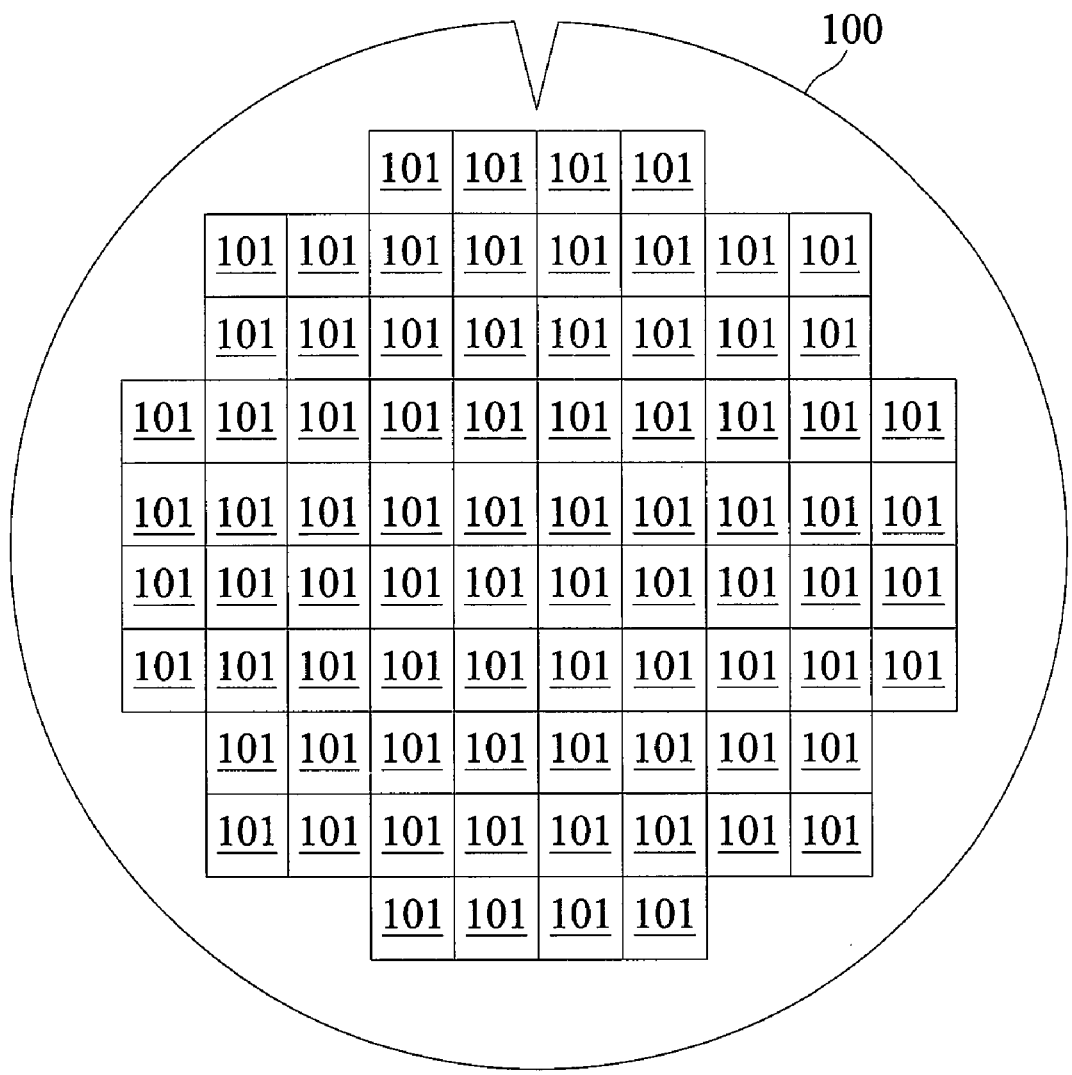
FIG. 1 shows a top view of a semiconductor wafer.

Referring to FIG. 1, a top view of a semiconductor wafer 100 is shown. The semiconductor wafer 100 is a wafer with completion of the integrated circuit process, and comprises a plurality of semiconductor dice 101. In a preferred embodiment of the invention, a wafer-level package is utilized as an example, and the structure and properties thereof are described. After completion of the integrated circuit process, the entire semiconductor wafer 100 is directly packaged, and the product is the wafer-level package. In this embodiment, the semiconductor wafer 100 is a silicon wafer. In other embodiments, the semiconductor wafer 100 can be a wafer of any other elemental semiconductors or semiconductor alloys, such as germanium, silicon germanium, gallium arsenide, or other semiconductors.

The packages of embodiments of the invention can be applied to various electronic components comprising active or passive elements, or digital or analog circuits, such as opto electronic devices, micro electro mechanical systems (MEMS), micro fluidic systems, or physical sensors performing measurement utilizing heat, light, pressure, or other physical changes. Especially, semiconductor dice of image sensors, light emitting diodes, solar cells, radio frequency (RF) circuits, accelerators, gyroscopes, micro actuators, surface acoustic wave (SAW) devices, pressure sensors, ink printer heads, or etc. can be packaged by the wafer level packaging process. In the wafer level packaging process, the wafer is divided into independent packages after completion of the packaging steps performed on the entire wafer. In a specific embodiment, however, the separated dice are redistributed on a carrier wafer, and then the packaging steps are performed thereon, for example, which can also be called a wafer level packaging process. The wafer level packaging process can be also performed on a plurality of stacking wafers comprising integrated circuits to form packages of multi-layer integrated circuit devices.

Figure 2A:
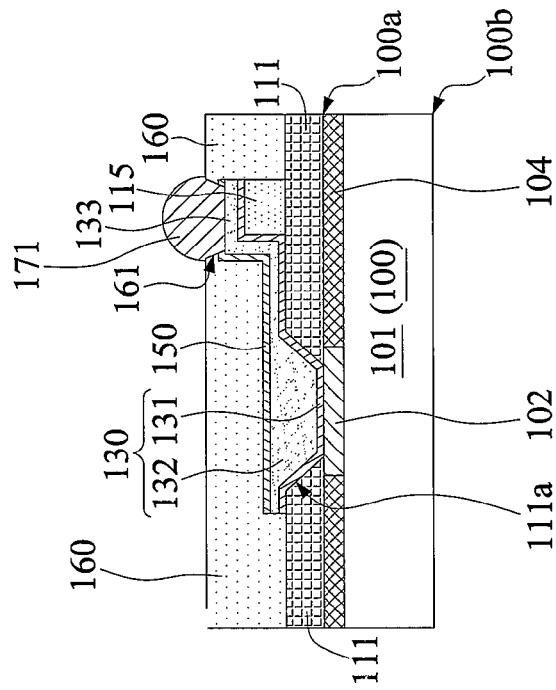
FIGS. 2A and 2B show cross-sections of a semiconductor device of a first embodiment of the invention.

Next, referring to FIG. 2A, a cross-section of one of the semiconductor dice 101 of the semiconductor wafer 100 shown in FIG. 1 is shown, which is a semiconductor device of a first embodiment of the invention, comprising one of the semiconductor dice 101 of the semiconductor wafer 100 shown in FIG. 1, a first passivation film 111, a wiring redistribution layer 130, an Ni/Au layer 150, and a solder mask 160.

The semiconductor wafer 100 comprises a front surface 100a, comprising an active surface, and a back surface 100b. Thus, the semiconductor die 101 also comprises the front surface 100a and the back surface 100b. The semiconductor die 101 further comprises a conductive electrode, such as a conductive contact pad, or a wiring redistribution layer. In this embodiment, a top metal 102, for example, functions as the conductive electrode. The top metal 102 electrically connects circuit elements to the interior of the semiconductor die. In this embodiment, the top metal 102 is embedded and exposed in a dielectric layer 104 overlying the front surface 100a of the semiconductor die 101. In other embodiments, the dielectric layer 104 shown in FIG. 2A is not formed. The semiconductor die 101 further comprises one or more metal interconnection layers and the corresponding ILD layers underlying the top metal 102, but because those underlying layers are not entirely related to the characteristics of the embodiments of the invention, the descriptions therefor are omitted for brevity.

A first passivation film 111 is disposed overlying the front surface 100a of the semiconductor die 101, acting as a passivation layer of the semiconductor die 101. The first passivation film 111 comprises a through opening 111a, acting as a passivation opening. The opening 111a is disposed overlying the top metal 102, and thus, exposes the top metal 102. The first passivation film 111 can be of substantially the same material as the subsequently described solder mask 160 or polyimide.

A wiring redistribution layer 130 is formed overlying the first passivation film 111 and electrically connects to the top metal 102 via the opening 111a. In one embodiment, the wiring redistribution layer 130 comprises an Al layer 132 and a TiW layer 131 on a bottom surface of the Al layer 132. In this embodiment, the TiW layer 131 is selected and utilized as an interface layer between the wiring redistribution layer 130 and the first passivation film 111/top metal 102, and is capable of tightly adhering the wiring redistribution layer 130 to the first passivation film 111/top metal 102.

An Ni/Au layer 150 is disposed overlying a top surface of the Al layer 132 of the wiring redistribution layer 130, and comprises an Ni film and an overlying Au film. The Ni/Au layer 150 can not only prevent the Al layer 132 from oxidization, but also function as an adhesion layer between the wiring redistribution layer 130 and the overlying solder mask 160 to increase adhesion strength therebetween, increasing the reliability of the semiconductor device of the first embodiment of the invention.

Further, the Al layer 132 is the main composition of the wiring redistribution layer 130, and the TiW layer 131 functions as an adhesion layer between the Al layer 132 and an underlying structure, not only contributing to increase the reliability of the semiconductor device of the first embodiment of the invention, but also simplifying the process for the wiring redistribution layer 130 and decreasing the process cost due to utilization of the Al layer 132.

The solder mask 160 is disposed overlying the first passivation film 111 and the wiring redistribution layer 130, and comprising an opening 161 exposing a terminal 133 of the wiring redistribution layer 130 and the Ni/Au layer 150 overlying the terminal 133. The solder mask 160 may also be called "green paint" due to the color thereof, and prevents circuit bridging resulting from when the wiring redistribution layer 130 contacts solder and the neighboring wiring redistribution layer (not shown) during subsequent processes, and prevents the semiconductor device of the first embodiment of the invention from invasion of contaminative materials such as moisture. An exemplary composition of the solder mask 160 comprises: (the subsequent "CAS No." means Registry Number in Chemical Abstracts Service)

(1) epoxy resin (CAS No.: 25068-38-6) with a concentration between 40.0% and less than 60.0%;

(2) 1-methoxy-2-propyl acetate (CAS No.: 108-65-6) with a concentration between 25.0% and less than 40.0%;

(3) Bisphenol-F epoxy resin ore poxy phenol novolac (CAS No.: 28064-14-4) with a concentration between 20.0% and less than 25.0%; and (4) 2-methoxypropyl acetate (CAS No.: 70657-70-4) with a concentration between 0.1% and less than 0.2%.

In one embodiment, the dielectric layer 104 and the described underlying ILD layers are low k dielectric layers, and thus, a stress buffer insulator 115 can be optionally disposed between the terminal 133 of the wiring redistribution layer 130 and the first passivation film 111 as required for buffering the exertion of exterior mechanical stress during subsequent processes and in the operation environment of the semiconductor device shown in FIG. 2A. Thus, the stress exertion on the dielectric layer 104 and the underlying ILD layers with lower mechanical strength can be prevented or decreased, preventing or decreasing the peeling thereof, or decreasing the peeling degree.

Figure 2B:
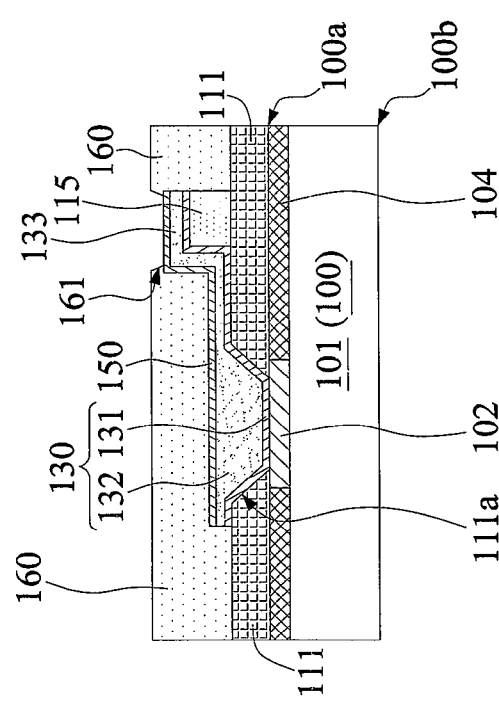

Referring to FIG. 2B, a bump 171, able to function as a connection element between the semiconductor device of the first embodiment of the invention and an exterior device such as a packaging substrate or a printed circuit board, can be formed overlying the terminal 133 and the overlying Ni/Au layer 150 exposed in the opening 161 by an electroplating, stencil printing of a paste material comprising conductive particles, ball placement, soldering, or other process methods. Exemplary materials of the bump 171 can be solder, gold, copper, gold or copper with solder coated in the surface, conductive polymers, or etc. As shown in FIG. 2B, when the bump 171 is solder, the Ni/Au layer 150 in the corresponding position is dissolved in the bump 171, forming intermetallic compounds with some composition, such as tin, of the bump 171 in an adhesion surface between the bump 171 and the Al layer 132, increasing adhesion strength between the bump 171 and the Al layer 132.

In FIG. 2B, the thickness of the solder mask 160 is higher than the wiring redistribution layer 130 and the overlying Ni/Au layer 150. For the bump 171, the deeper opening 161 can provide a deeper and more stable foundation to increase the adhesion of the bump 171, further increasing the reliability of the semiconductor device of the first embodiment of the invention.

Next, the semiconductor device of a second embodiment of the invention shown in FIGS. 3A and 3B provides a composite passivation structure for further stress buffer ability, enhancing the protection of the dielectric layer 104 and the described underlying ILD layers.

The semiconductor wafer 100, the semiconductor die 101, the front surface 100a, the back surface 100b, the conductive electrode 102, the dielectric layer 104, the first passivation film 111, the wiring redistribution layer 130 and the TiW layer 131 and the Al layer 132 thereof, the Ni/Au layer 150, and the solder mask 160 and the opening 161 thereof are the same with or similar to those described for FIGS. 2A and 2B, and thus, descriptions are omitted.

As compared with that shown in FIG. 2A, the passivation layer 110 of the semiconductor device of the second embodiment of the invention shown in FIG. 3A comprises a multilayer composite structure, and a metal layer 120 is embedded therein. The passivation layer 110 can be divided into a first passivation film 111 underlying the metal layer 120 and a second passivation film 112 overlying the first passivation film 111 due to the embedded metal layer 120. The second passivation film 112 also comprises an opening 112a exposing the top metal 102. In this embodiment, the opening 112a is a passivation opening through the entire thickness of the passivation layer 110. The wiring redistribution layer 130 is formed overlying the second passivation film 112 of the passivation layer 110 and electrically connecting the top metal 102 through the opening 112a.

In this embodiment, the dielectric layer 104 and the described underlying ILD layers are low k dielectric layers. When the semiconductor device shown in FIG. 3A is exerted by exterior mechanical stress during subsequent processes and in the operation environment, a sandwich structure of the second passivation film 112-the metal layer 120-the first passivation film 111 of the passivation layer 110 and the embedded metal layer 120 can perform stress buffering to reduce, or even prevent peeling to occur in the dielectric layer 104 and the underlying ILD layers due to exterior stress. Further, an optional stress buffer insulator 115 can be disposed between the terminal 133 of the wiring redistribution layer 130 and the passivation layer 110 as required to further enhance the protection to the dielectric layer 104 and the underlying ILD layers due to the addition of a layer of buffer material.

In addition, if an electro-deposition coating material comprising epoxy or polyimide is selected to be the material of the second passivation film 112, not only will the second passivation film 112 be formed overlying the metal layer 120, but also the second passivation film 112 can be simultaneously formed overlying the back surface 100b of the semiconductor wafer 100 (or the semiconductor die 101). The second passivation film 112 overlying the back surface 100b can be a stress buffer layer of the semiconductor wafer 100 (or the semiconductor die 101), preventing the brittle semiconductor wafer 100 (or semiconductor die 101) from breaking or chipping due to exterior stress during handling or subsequent processes (such a die saw process). Further, a mark can be carved on the second passivation film 112 overlying the back surface 100b by a laser process or other processes to record the identity, states, and/or other necessary information of every semiconductor die 101. In other embodiment, the selected material for the second passivation film 112 can be the same as that for the first passivation film 111 or other known dielectric materials, and thus, the second passivation film 112 may be not formed overlying the back surface 100b.

In the embodiment shown in FIG. 3A, the top metal 102 is an I/O (input/output) contact of the semiconductor die 101, and thus, is isolated from the metal layer 120 by the passivation layer 110. The metal layer 120 of this embodiment does not electrically contact the top metal 102. The metal layer 120 shown in FIG. 3A can function not only a stress buffer layer, but also a shielding layer that prevents or decreases environmental electromagnetic interference to occur in the circuits of the interconnections of the semiconductor die 101.

Next, referring to FIG. 3B, the semiconductor die 101 may further comprise a top metal 106 exposed in the front surface 100a. When the top metal 106 functions as a ground contact of the semiconductor die 101, or a dummy contact disposed for uniform or symmetrical arrangement of every contact, the metal layer 120 can electrically connect to the top metal 106. At this time, the metal layer 120 can be a stress buffer layer, a shielding layer, and a ground layer.

In FIG. 3B, the metal layer 120 electrically connects to the top metal 106 exposed in the opening 111b through the opening 111b of the first passivation film 111. After formation of the second passivation film 112, the opening 112b becomes a passivation opening through the entire thickness of the passivation layer 110, and exposes the top metal 106 and the overlying metal layer 120.

A wiring redistribution layer 140 is formed overlying the second passivation film 112 of the passivation layer 110, and electrically connects to the top metal 106 via the opening 112b. The wiring redistribution layer 140 comprises an Al layer 142 and a TiW layer 141 on a bottom surface of the Al layer 142. In this embodiment, the TiW layer 141 is selected and utilized as an interface layer between the wiring redistribution layer 140 and the second passivation film 112/top metal 106, and is capable of tightly adhering the wiring redistribution layer 140 to the second passivation film 112/top metal 106. The Ni/Au layer 150 is also formed overlying a top surface of the Al layer 142 of the wiring redistribution layer 140.

Similarly, the Al layer 142 is the main composition of the wiring redistribution layer 140, and the TiW layer 141 functions as an adhesion layer between the Al layer 142 and an underlying structure, not only also contributing to increase of the reliability of the semiconductor device of the second embodiment of the invention, but also simplifying the process for the wiring redistribution layer 140 and decreasing the process cost due to utilization of the Al layer 142.

The solder mask 160 is disposed overlying the second passivation film 112 and the wiring redistribution layer 140, and comprises an opening 162 exposing a terminal 143 of the wiring redistribution layer 140 and the Ni/Au layer 150 overlying the terminal 143.

The stress protection effect of the passivation layer 110 and the embedded metal layer 120 with that shown in FIG. 3B is similar with the descriptions for FIG. 3A. Further, an optional stress buffer insulator 116 can be disposed between the terminal 143 of the wiring redistribution layer 140 and the passivation layer 110 as required to further enhance protection of the dielectric layer 104 and the underlying ILD layers due to the addition of a layer of buffer material.

Further, a bump structure (not shown) the same as or equivalent with that shown in FIG. 2B can be also formed overlying the terminals 133, 143 and the overlying Ni/Au layer 150 exposed by the openings 161, 162.

Next, in FIGS. 4A through 4H and 5A through 5F, cross-sections of a manufacturing method for the semiconductor device of a preferred embodiment of the invention are shown. The devices achieved by the steps shown in FIGS. 4A through 4H and 5A through 5F are semiconductor devices shown in FIGS. 3A and 3B. The steps, however, may also be applied to manufacturing of the semiconductor devices shown in FIGS. 2A and 2B.

Further, every cross-section shown in FIGS. 4A through 4H and 5A through 5F, is respectively divided into regions 1 and 2. The region 1 presents the manufacturing method for the semiconductor devices shown in FIG. 3A, and the region 2 presents the manufacturing method for the semiconductor devices shown in FIG. 3B. The detailed description is described as follows.

Figure 4A:
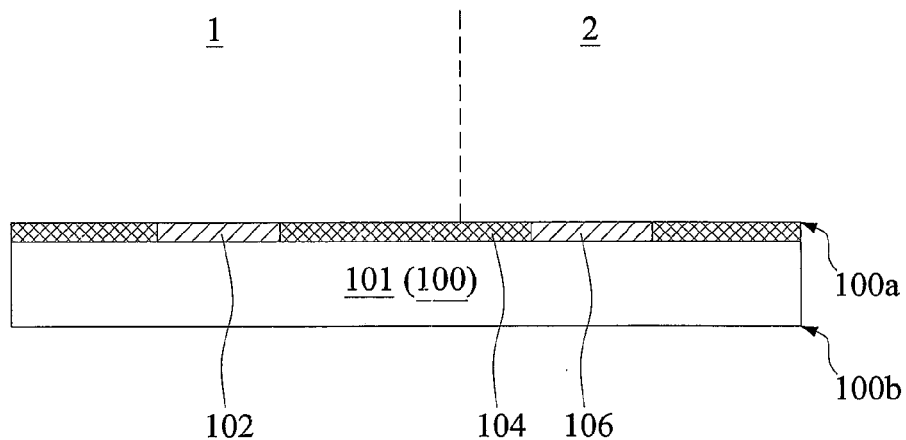
FIGS. 4A through 4H and 5A through 5F show cross-sections of a manufacturing method for the semiconductor device shown in FIGS. 3A and 3B.

First, referring to FIG. 4A, a semiconductor wafer 100 is provided in this step. The semiconductor wafer 100 comprises at least one semiconductor die 101. The semiconductor die 101 comprises conductive electrodes, such as top metals 102 and 106 exposed in the front surface 100a of the semiconductor wafer 100. An exemplary top view of the semiconductor wafer 100 is shown in FIG. 1. As described, the top metals 102 and 106 are respectively an I/O contact of the semiconductor die 101, and a ground contact of the semiconductor die 101 or a dummy contact disposed for uniform or symmetrical arrangement of every contact. The top metals 102 and 106 are isolated by the dielectric layer 104.

Figure 4B:
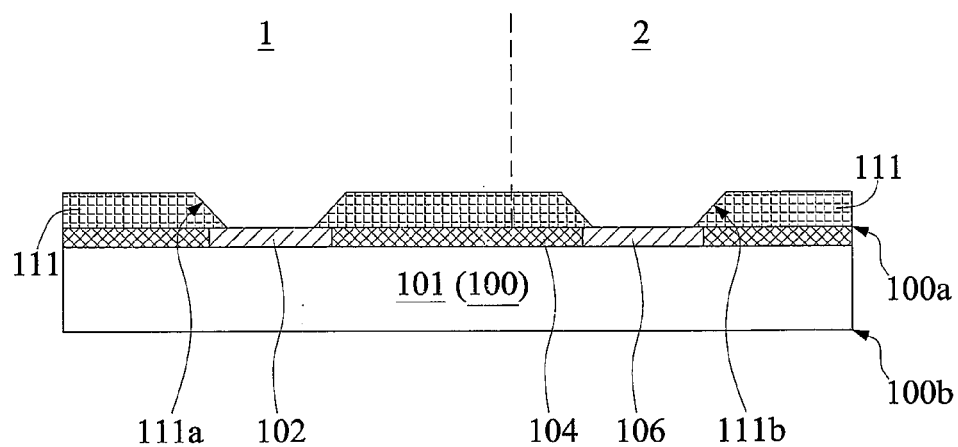

Next, referring to FIG. 4B, a first passivation film 111 is formed overlying the semiconductor wafer 100. The first passivation film 111 comprises openings 111a and 1110 respectively exposing the top metals 102 and 106. For example, the first passivation film 111 can be formed overlying the entire active surface 100a of the semiconductor wafer 100, followed by patterning the first passivation film 111 utilizing a technology such as a lithography process, thus forming the openings 111a and 1110 respectively exposing the top metals 102 and 106.

Figure 4C:
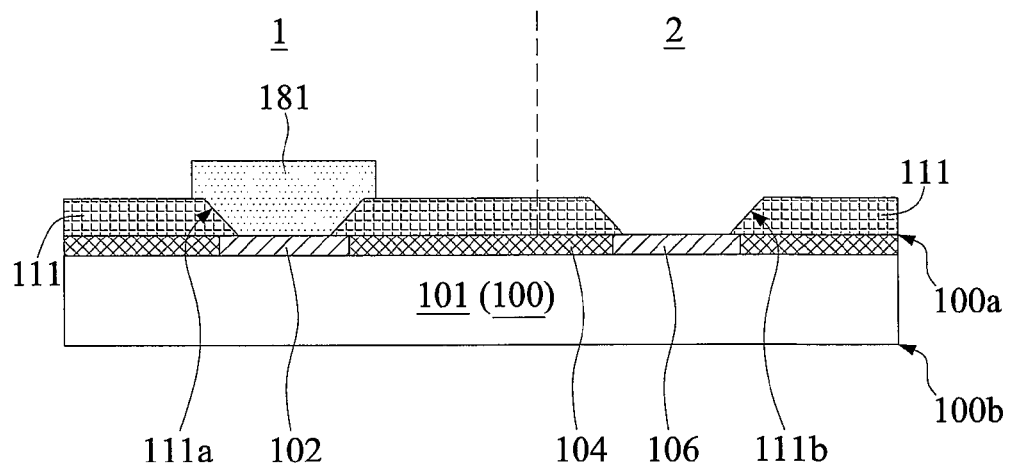

Then, referring to FIG. 4C, a resist material 181 is formed covering the top metal 102 exposed in the opening 111a, wherein the top metal 106 is exposed in the opening 111b and is not covered by the resist material 181. For example, a resist layer (not shown) can be formed overlying the overall semiconductor wafer 100 comprising the structure shown in FIG. 4B by a spin coating process, for example, followed by exposure of the resist layer through a mask (not shown) and a developing step to remove other unwanted resist material, to complete the resist material 181 shown in FIG. 4C. The completed resist material 181 may slightly go beyond the range of the opening 111a and expand to overlie the first passivation film 111 near and around the opening 111a.

Figure 4D:
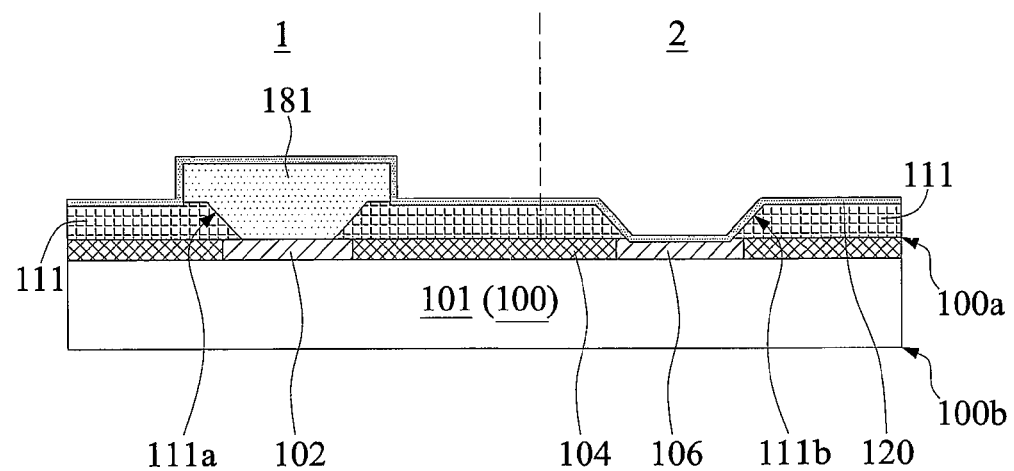

Then, referring to FIG. 4D, a metal layer 120 is deposited overlying the first passivation film 111, the resist material 181, sidewalls of the opening 111b, and the exposed top metal 106. For example, the metal layer 120 can be deposited overlying the entire semiconductor wafer 100 comprising the structure shown in FIG. 4C by an evaporation, sputtering, or other physical or chemical vapor deposition processes.

Figure 4E:
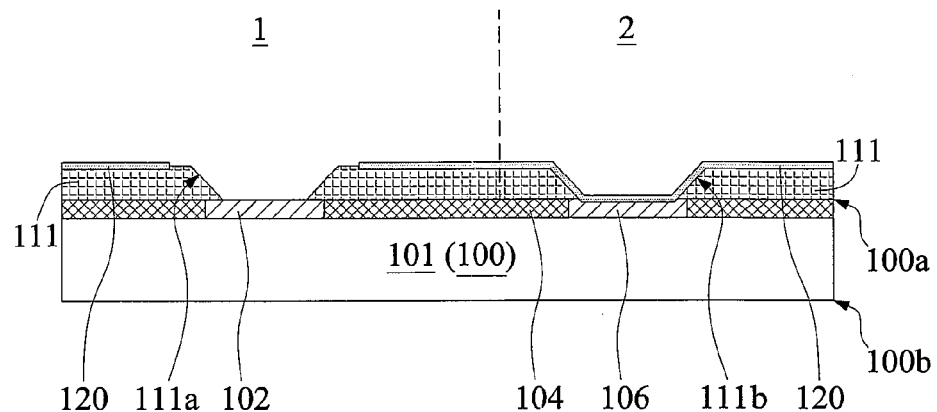

Then, referring to FIG. 4E, the resist material 181 shown in FIG. 4D is removed by lift-off, and the metal layer 120 overlying the resist material is simultaneously removed, leaving a discontinuous metal layer overlying the first passivation film 111 beyond the opening 111a and extending into the opening 111b. Further, the range of the metal layer 120 removed around the opening 111a can be slightly expanded when removing the resist material 181 as shown in FIG. 4D.

Further, when the semiconductor device shown in FIG. 3B is considered to be formed, the steps shown in FIGS. 4C and 4E are not required, while performing the step as shown in FIG. 4D.

Figure 4F:
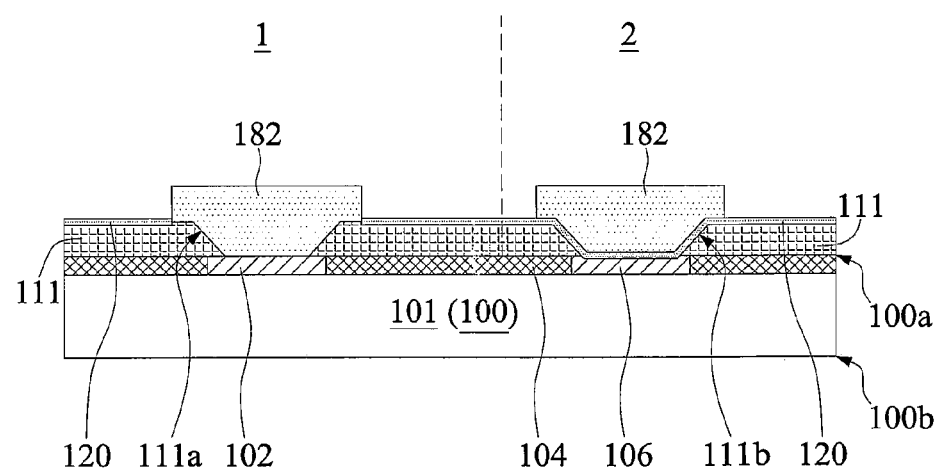

Then, referring to FIG. 4F, a sacrifice layer 182 is filled in the openings 111a and 111b. The material and formation method for the sacrifice layer 182 can be the same those of the resist material 181. Similarly, the completed sacrifice layer 182 may slightly go beyond the range of the openings 111a and 111b, and expand to overlie the first passivation film 111 near and around the openings 111a and 111b.

Figure 4G:
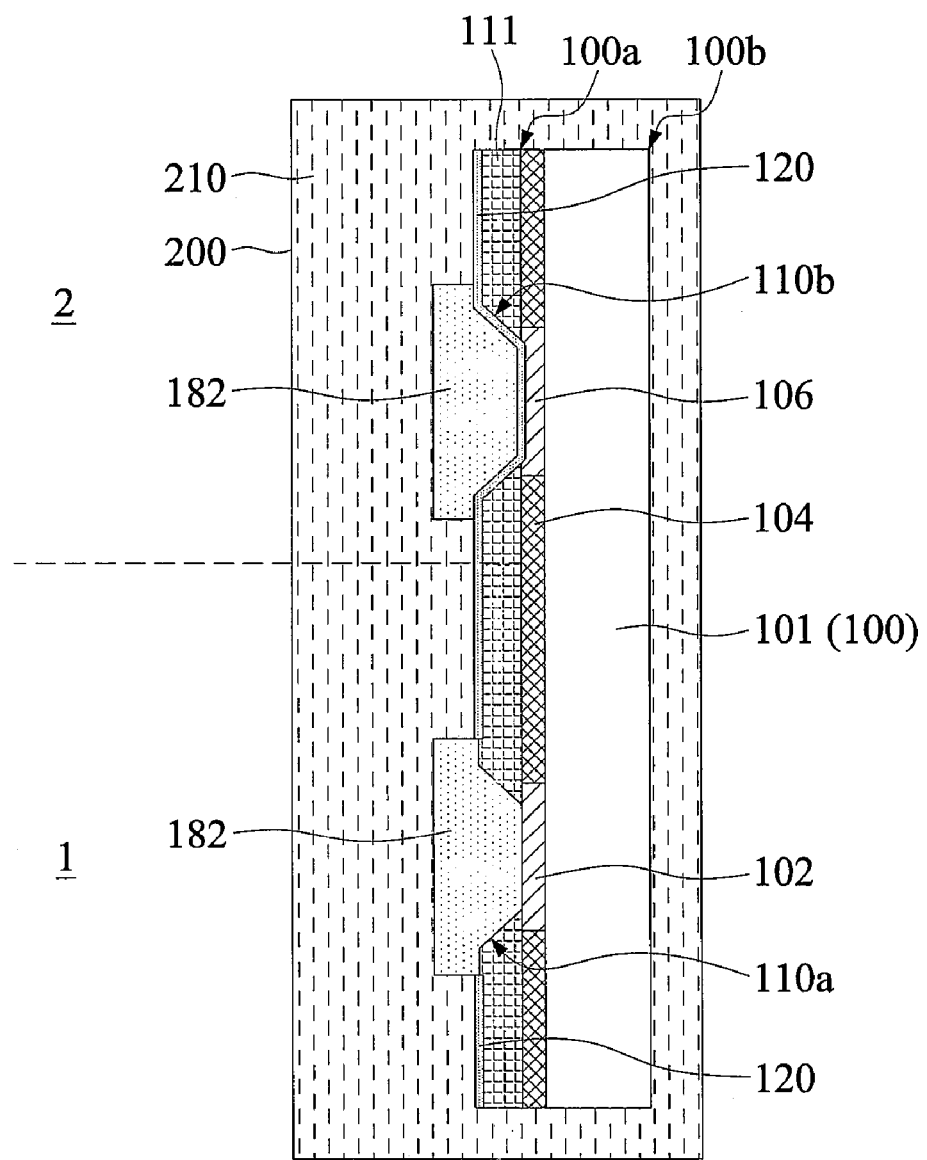
Figure 4H:
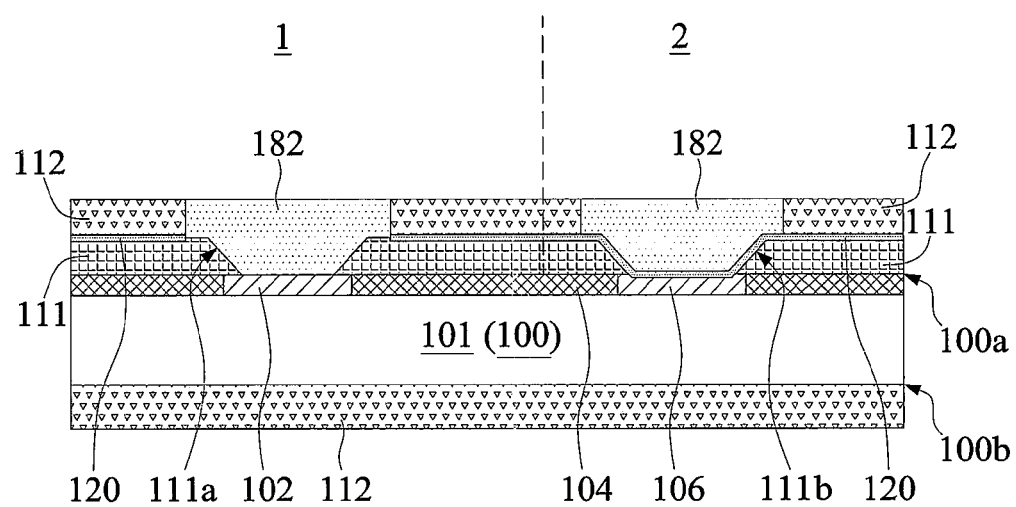

Then, referring to FIG. 4G, a solution 210 comprising an electro-deposition coating material comprising epoxy resins or polyimide is provided in this step. The solution 210 is held in a container 200. The size of the container 200 is large enough for immersing the semiconductor wafer 100 and the structures overlying the semiconductor wafer 100 into the solution 210. After electrifying, next, the insulating material would only attach to the exposed metal layer 210 and the back surface 100b of the semiconductor wafer 100 due to the properties thereof, forming a second passivation film 112. The completed structure is shown in FIG. 4H. Thus, according to this embodiment of the invention, a further step of forming a protective layer overlying the back surface 100b can be omitted, decreasing the process cost of the semiconductor device of preferred embodiments of the invention.

Figure 5A:
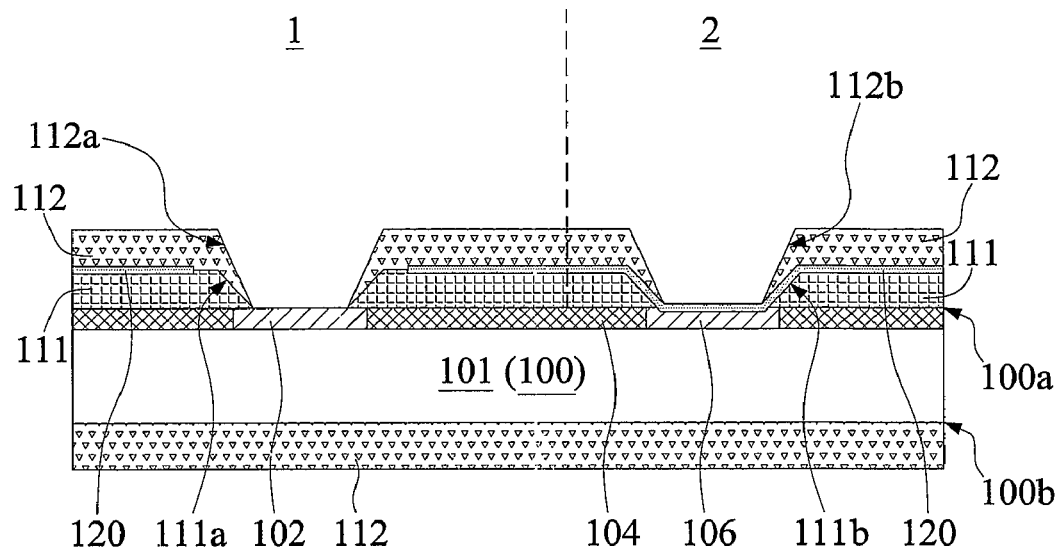

Then, referring to FIG. 5A, the sacrifice layer 182 shown in FIG. 4H is removed, resulting in the second passivation film 112 comprising an opening 112a exposing the top metal 102 and an opening 112b exposing the top metal 106. In some cases, a reflow step may be performed after removing the sacrifice layer 182. The second passivation film 112 around but beyond the openings 111a and 111b shown in FIG. 4H may flow into the edges of the openings 111a and 111b and cover the sidewalls of the openings 111a and 111b as shown in FIG. 5A. At this time, the openings 112a and 112b become passivation openings of the passivation layer 110 through the thicknesses of the first passivation film 111 and the second passivation film 112.

Figure 5B:
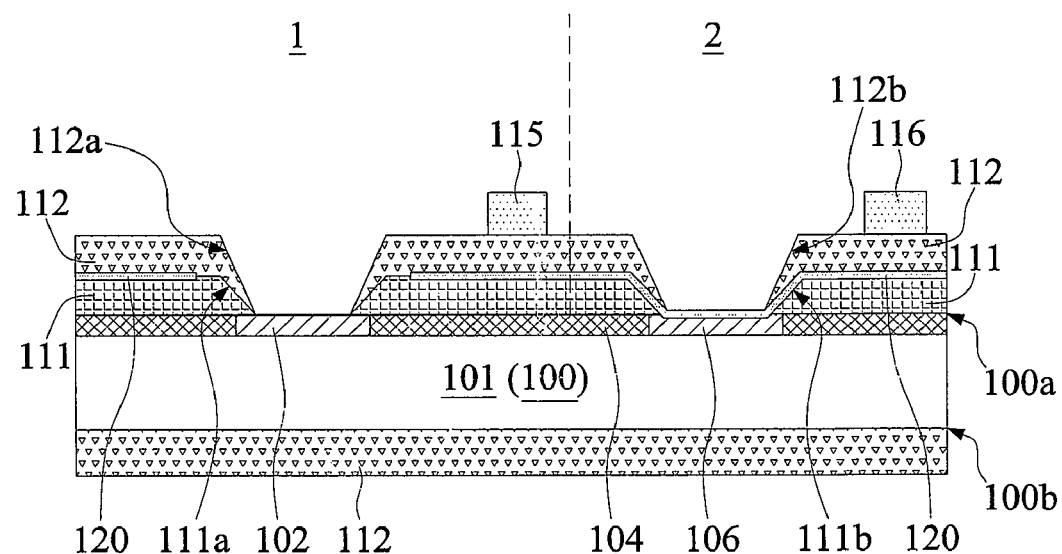

Next, the step shown in FIG. 5B is not necessary in some embodiments of the invention, but an optional step as required. As shown in FIG. 5B, stress buffer insulators 115 and 116 are respectively formed overlying the predetermined positions of the terminal 133 of the wiring redistribution layer 130 of the second passivation film 112, and the terminal 143 of the wiring redistribution layer 140 of the second passivation film 112. For example, a raw material layer (not shown) of the stress buffer insulators can be formed overlying the overall semiconductor wafer 100 comprising the structure shown in FIG. 5A, followed by patterning of the raw material layer in some steps by a process such as a lithography process, completing the stress buffer insulators 115 and 116 as shown in FIG. 5B.

Figure 5C:
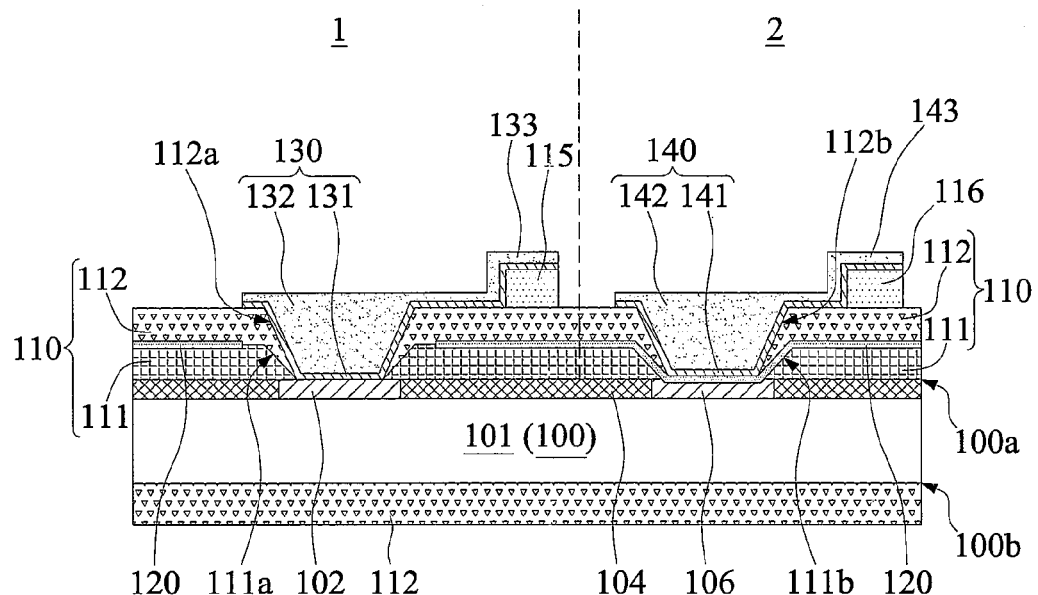

Then, referring to FIG. 5C, wiring redistribution layers 130 and 140 are formed overlying the passivation layer 110. The wiring redistribution layer 130 electrically connects to the top metal 102 through the opening 112a. The wiring redistribution layer 140 electrically connects to the top metal 106 through the opening 112b. The wiring redistribution layer 130 comprises an Al layer 132 and a TiW layer 131 on the bottom surface of the Al layer 132. The wiring redistribution layer 140 comprises an Al layer 142 and a TiW layer 141 on the bottom surface of the Al layer 142. For example, raw material layers of TiW and Al can be sequentially formed overlying the structure overlying the active surface 100a of the semiconductor wafer 100 as shown in FIG. 5A or 5B by an evaporation, sputtering, or other physical or chemical vapor deposition processes, followed by patterning of the raw material layers of TiW and Al in some steps by a process such as a lithography process, completing the wiring redistribution layer 130 and 140 shown in FIG. 5C. When the stress buffer insulators 115 and 116 are optionally formed, the terminal 133 of the wiring redistribution layer 130 and the terminal 143 of the wiring redistribution layer 140 are respectively formed overlying the stress buffer insulators 115 and 116.

Figure 5D:
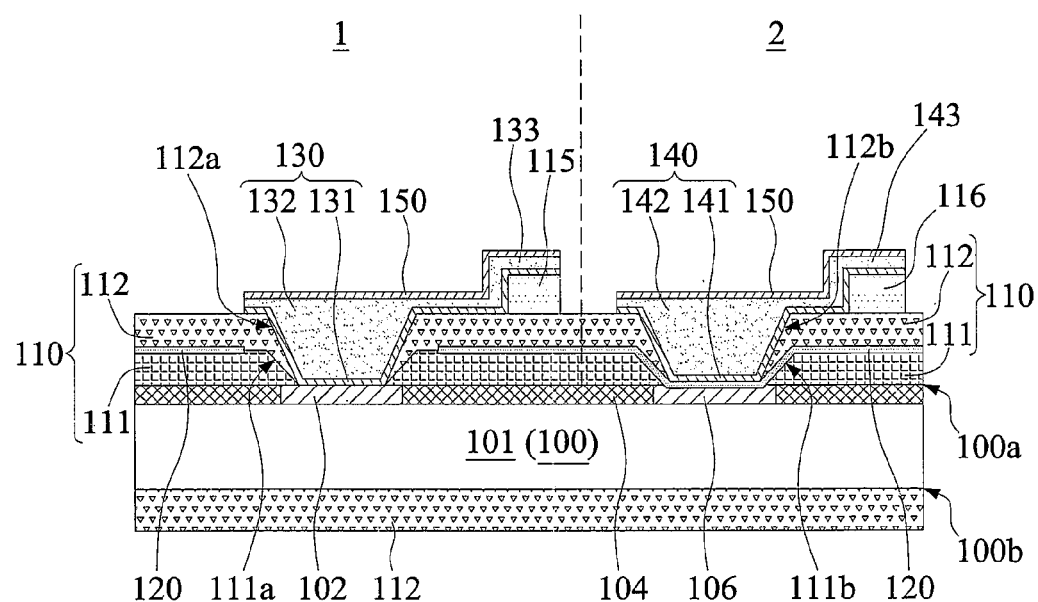

Then, referring to FIG. 5D, an Ni/Au layer 150 is plated overlying a top surface of the Al layer 132 of the wiring redistribution layer 130, and a top surface of the Al layer 142 of the wiring redistribution layer 140. For example, an Ni metal layer (not shown) and an Au metal layer (not shown) can be sequentially plated overlying the top surfaces of the Al layers 132 and 142 by a technology such as an electroplating, or electroless plating process, or a combination method thereof, completing the Ni/Au layer 150 shown in FIG. 5D.

Figure 5E:
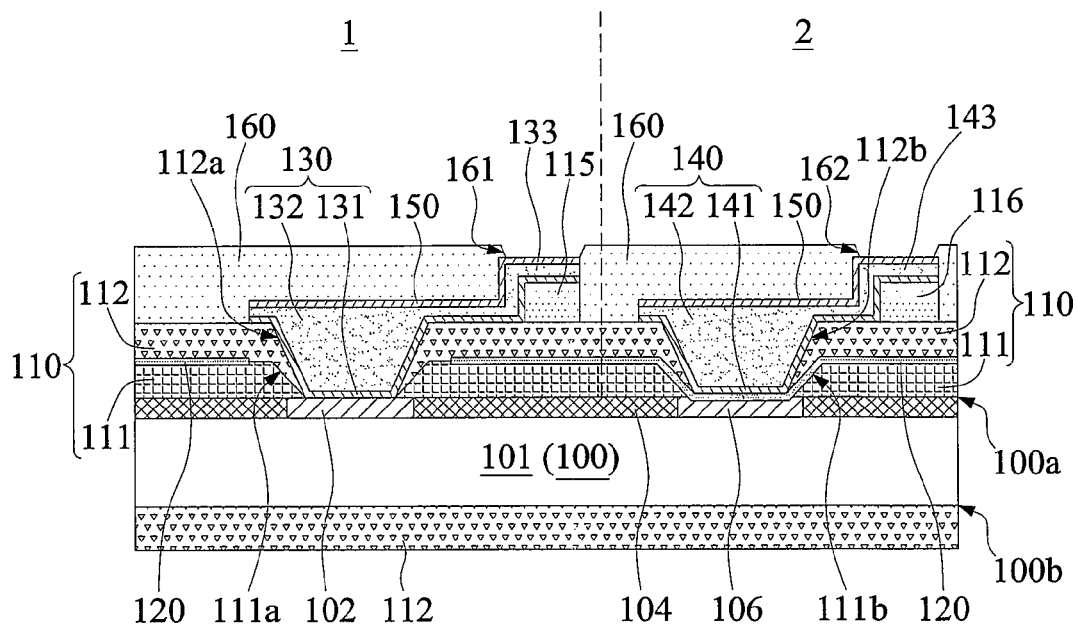

Then, referring to FIG. 5E, a solder mask 160 is formed overlying the passivation layer 110, the wiring redistribution layer 130, and the wiring redistribution layer 140, exposing the terminal 133 of the wiring redistribution layer 130 and the overlying Ni/Au layer 150, and the terminal 143 of the wiring redistribution layer 140 and the overlying Ni/Au layer 150. For example, a green paint layer (not shown) is coated overlying an overlying structure of the semiconductor wafer 100 shown in FIG. 5D, followed by steps of a process such as a lithography, etching, and etc. process, forming openings 161 and 162 respectively exposing the terminal 133 and the overlying Ni/Au layer 150, and the terminal 143 and the overlying Ni/Au layer 150. Next, a hardening step such as light illumination or heating may be optionally performed or not, depending on the properties of the raw material of the solder mask 160. Finally, the solder mask shown in FIG. 5E is completed. As shown in FIG. 5E, the structure shown in the region 1 is that of the semiconductor device shown in FIG. 3A, and the structure shown in the region 2 is that of the semiconductor device shown in FIG. 3B.

Figure 5F:
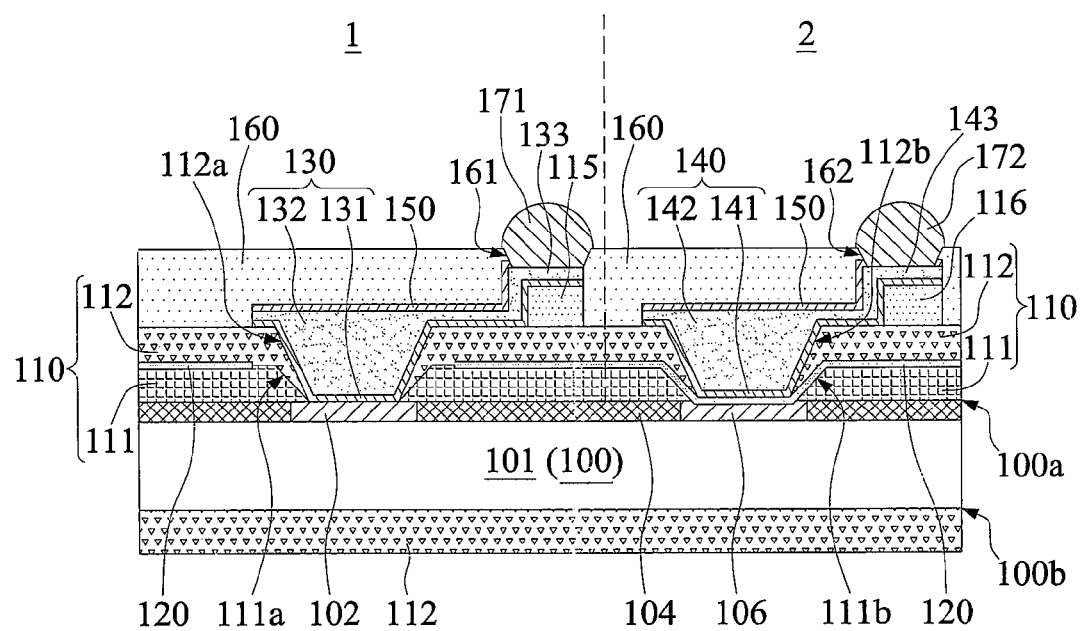

Then, referring to FIG. 5F, a bump 171 and a bump 172 are respectively formed overlying the structures exposed in the openings 161 and 162 shown in FIG. 5E. The materials of the bumps 171 and 172 are preferably substantially the same, and conductive. When the bumps 171 and 172 are solder, the Ni/Au layer 150 in the openings 161 and 162 is dissolved in the bumps 171 and 172, forming intermetallic compounds in the interfaces between the bumps 171, 172 and the underlying Al layers 132, 142 as aforementioned.

Further, regarding the manufacturing method for the semiconductor devices shown in FIGS. 2A and 2B, the steps and structures shown in any of regions 1 and 2 in FIGS. 4A through 4H and 5A through 5H can be referred. When it is desired to form the semiconductor devices shown in FIGS. 2A and 2B, the steps described for FIGS. 4A and 4B are first performed. After completing the structure shown in FIG. 4B, the first passivation film 111 functions as the completed passivation layer, and the openings 111a and/or 112a function as the passivation opening(s) through the thickness of the passivation layer, followed by directly performing the steps equivalent with those shown in FIG. 5B or 5C and thereafter. Similarly, the step equivalent with that shown in FIG. 5B is not necessary in some embodiments of the invention, but an optional step as required. The step shown in FIG. 5C, however, is modified such that the wiring redistribution layers 130 and/or 140 are formed overlying the first passivation film 111, the wiring redistribution layer 130 electrically connects to the top metal 102 via the opening 111a, the wiring redistribution layer 140 electrically connects to the top metal 106 via the opening 111b, the wiring redistribution layer 130 comprises an Al layer 132 and a TiW layer 131 on the bottom surface of the Al layer 132, and the wiring redistribution layer 140 comprises an Al layer 142 and a TiW layer 141 on the bottom surface of the Al layer 142. Next, the steps equivalent with those shown in FIGS. 5D and 5E are sequentially performed, completing the semiconductor device shown in FIG. 2A. Next, the step equivalent with that shown in FIG. 5F is performed, completing the semiconductor device shown in FIG. 2B.

While the invention has been described by way of example and in terms of preferred embodiment, it is to be understood that the invention is not limited thereto. To the contrary, it is intended to cover various modifications and similar arrangements (as would be apparent to those skilled in the Art). Therefore, the scope of the appended claims should be accorded the broadest interpretation so as to encompass all such modifications and similar arrangements.

What is claimed is:

1. A semiconductor device, comprising:
a semiconductor die comprising a first surface;
a conductive electrode exposed in the first surface;
a passivation layer overlying the semiconductor die and comprising a through passivation opening overlying the conductive electrode;
a metal layer embedded in the passivation layer, wherein the passivation layer further comprises a first passivation film and a second passivation film sandwiching the metal layer;
a wiring redistribution layer, comprising an Al layer, overlying the passivation layer and electrically connecting to the conductive electrode via the passivation opening;
an Ni/Au layer overlying a top surface of the Al layer of the wiring redistribution layer; and
a solder mask overlying the passivation layer and the wiring redistribution layer, exposing a terminal of the wiring redistribution layer and the overlying Ni/Au layer.

2. The device as claimed in claim 1, wherein
the metal layer is disposed on the first passivation film; and
the second passivation film is not only disposed on the first passivation film and the metal layer, but also on a second surface of the semiconductor die opposing to the first surface thereof.

3. The device as claimed in claim 1, wherein
the first passivation film is of substantially the same material as the solder mask or polyimide; and
the wiring redistribution layer further comprises a TiW layer on a bottom surface of the Al layer.

4. The device as claimed in claim 1, wherein the second passivation film is an insulating film of an electro-deposition coating material.

5. The device as claimed in claim 1, further comprising a stress buffer insulator disposed between the terminal of the wiring redistribution layer and the passivation layer.

6. The device as claimed in claim 1, wherein
the conductive electrode is an input/output (I/O) contact of the semiconductor die; and
the metal layer is electrically isolated from the conductive electrode by the passivation layer, acting as an electromagnetic shielding layer.

7. The device as claimed in claim 6, wherein the conductive electrode is a ground contact or dummy contact of the semiconductor die, and the metal layer electrically connects to the conductive electrode.

8. A semiconductor device, comprising:
a semiconductor die comprising a first surface;
a first conductive electrode and a second conductive electrode exposed in the first surface;
a passivation layer overlying the semiconductor die and comprising a first through passivation opening overlying the first conductive electrode and a second through passivation opening overlying the second conductive electrode;
a metal layer embedded in the passivation layer, electrically connecting to the second conductive electrode, and electrically isolated from the first conductive electrode by the passivation layer;
a first wiring redistribution layer, comprising a first Al layer, overlying the passivation layer and electrically connecting to the first conductive electrode via the first passivation opening;
a second wiring redistribution layer, comprising a second Al layer, overlying the passivation layer and electrically connecting to the second conductive electrode via the second passivation opening;

an Ni/Au layer overlying a top surface of the first Al layer of the first wiring redistribution layer and a top surface of the second Al layer of the second wiring redistribution layer; and a solder mask overlying the passivation layer, the first wiring redistribution layer, and the second wiring redistribution layer, exposing a first terminal of the first wiring redistribution layer and the overlying Ni/Au layer, and a second terminal of the second wiring redistribution layer and the overlying Ni/Au layer.

9. The device as claimed in claim 8, wherein
the passivation layer further comprises a first passivation film and a second passivation film sandwiching the metal layer;
the first wiring redistribution layer further comprises a first TiW layer on a bottom surface of the first Al layer;
the second wiring redistribution layer further comprises a second TiW layer on a bottom surface of the second Al layer; wherein
the metal layer is disposed on the first passivation film; and
the second passivation film is not only disposed on the first passivation film and the metal layer, but also on a second surface of the semiconductor die opposing to the first surface thereof.

10. The device as claimed in claim 9, wherein
the second passivation film is an insulating film of an electro-deposition coating material;
the first conductive electrode is an input/output (I/O) contact of the semiconductor die; and
the second conductive electrode is a ground contact or dummy contact of the semiconductor die.

11. A semiconductor device, comprising:
a semiconductor die comprising a first surface;
a conductive electrode exposed in the first surface;
a passivation layer overlying the semiconductor die and comprising a through passivation opening overlying the conductive electrode;
a metal layer embedded in the passivation layer;
a wiring redistribution layer, overlying the passivation layer and electrically connecting to the conductive electrode via the passivation opening; and
a solder mask overlying the passivation layer and the wiring redistribution layer, exposing a terminal of the wiring redistribution layer.

12. The device as claimed in claim 11, wherein the passivation layer further comprises a first passivation film and a second passivation film sandwiching the metal layer.

13. The device as claimed in claim 12, wherein
the metal layer is disposed on the first passivation film; and
the second passivation film is not only disposed on the first passivation film and the metal layer, but also on a second surface of the semiconductor die opposing to the first surface thereof.

14. The device as claimed in claim 13, wherein
the first passivation film is of substantially the same material as the solder mask or polyimide; and
the wiring redistribution layer further comprises a TiW layer on a bottom surface of the Al layer.

15. The device as claimed in claim 13, wherein the second passivation film is an insulating film of an electro-deposition coating material.

16. The device as claimed in claim 11, further comprising a stress buffer insulator disposed between the terminal of the wiring redistribution layer and the passivation layer.

17. The device as claimed in claim 11, wherein
the conductive electrode is an input/output (I/O) contact of the semiconductor die; and
the metal layer is electrically isolated from the conductive electrode by the passivation layer, acting as an electromagnetic shielding layer.

18. The device as claimed in claim 11, wherein the conductive electrode is a ground contact or dummy contact of the semiconductor die, and the metal layer electrically connects to the conductive electrode.

19. A semiconductor device, comprising:
a semiconductor die comprising a first surface;
a conductive electrode exposed in the first surface;
a passivation layer overlying the semiconductor die and comprising a through passivation opening overlying the conductive electrode;
a metal layer embedded in the passivation layer, wherein the passivation layer further comprises a first passivation film and a second passivation film sandwiching the metal layer;
a wiring redistribution layer, overlying the passivation layer and electrically connecting to the conductive electrode via the passivation opening; and
a solder mask overlying the passivation layer and the wiring redistribution layer, exposing a terminal of the wiring redistribution layer.

* * * * *